United States Patent
Deng et al.

(10) Patent No.: US 7,675,382 B2
(45) Date of Patent: Mar. 9, 2010

(54) TRANSISTOR SINGLE-POLE-SINGLE-THROW CIRCUIT DEVICE

(75) Inventors: Ping-Yuan Deng, Taipei (TW); Jean-Fu Kiang, Taipei (TW)

(73) Assignee: National Taiwan University, Taipei (TW)

( * ) Notice: Subject to any disclaimer, the term of this patent is extended or adjusted under 35 U.S.C. 154(b) by 104 days.

(21) Appl. No.: 12/142,361

(22) Filed: Jun. 19, 2008

(65) Prior Publication Data

US 2009/0189718 A1 Jul. 30, 2009

(30) Foreign Application Priority Data

Jan. 25, 2008 (TW) .............................. 97102781 A

(51) Int. Cl.
*H01P 1/15* (2006.01)
*H04B 1/44* (2006.01)

(52) U.S. Cl. ....................... 333/103; 333/101
(58) Field of Classification Search ................. 333/101, 333/103, 104, 262
See application file for complete search history.

(56) References Cited

U.S. PATENT DOCUMENTS

| 6,118,985 A * | 9/2000 | Kawakyu et al. ............... 455/78 |
| 6,281,762 B1 * | 8/2001 | Nakao et al. ................ 333/103 |
| 6,693,498 B1 * | 2/2004 | Sasabata et al. ............. 333/103 |

* cited by examiner

*Primary Examiner*—Dean O Takaoka
(74) *Attorney, Agent, or Firm*—Pearne & Gordon LLP

(57) ABSTRACT

A transistor single-pole-single-throw circuit device includes at least a transistor single-pole-single-throw circuit having a first transistor and a second transistor, and an inductor capacitor (LC) resonator having an inductor and a capacitor connected in series, allowing two ends of the LC resonator connected to the first source and the first drain of the first transistor, respectively. The transistor single-pole-single-throw circuit device adopts an LC resonator having an inductor and a capacitor connected in series to connect with the first source and the first drain of the first transistor. The inductor couples and resonates with a parasitic capacitance of the transistor, to reduce signal loss due to emerged parasitic capacitance when the conventional single-pole-single-throw circuit selects a switch transistor with a larger width.

9 Claims, 3 Drawing Sheets

TRANSISTOR SINGLE-POLE-SINGLE-THROW CIRCUIT DEVICE

BACKGROUND OF THE INVENTION

1. Field of the Invention

The present invention relates generally to a switch circuit, and more particularly, to a transistor single-pole-single-throw circuit device.

2. Description of Related Art

A metal-oxide-semiconductor (MOS) field-effect transistor (MOSFET) is a type of FETs widely applied in electronic devices, such as computers and communication apparatuses. Please refer to FIG. 1. A typical MOS 10 comprises at least three ports: a gate 11, a source 12, and a drain 13. The gate 11 comprises a metal layer 111, an oxide layer 112 and a semiconductor layer 113 stacked in order and has a structure similar to a capacitor. Thus, the MOSFET 10 is named a metal-oxide-semiconductor field-effect transistor in accordance with its structure.

Before the field-effect transistor operates, no external voltage is applied between the gate 11 and the source 12, and no current flows from the source 12 to the drain 13. When a voltage difference $V_{GS}$ is applied between the gate 11 and the source 12 of the MOSFET 10 and the voltage difference $V_{GS}$ reaches to a predetermined threshold voltage $V_T$, induction charge emerges on an interface between the oxide layer 112 and the semiconductor layer 113, generating a conduction electron layer of an inversion channel.

The conduction electron layer allows currents to flow between the drain 113 and the source 112. Currents flowing through the inversion channel of the MOSFET 10 vary in accordance with the voltage applied to the gate 111. When $V_{GS} > V_T$, a voltage difference $(V_{GS} - V_T)$ between the voltage applied to the gate 111 and the threshold voltage $V_T$ provides the conduction electron layer with a potential energy. Therefore, the electron density of the conduction electron layer is approximately directly proportional to $(V_{GS} - V_T)$, and an on-resistance $R_{on}$ of the conduction electron layer is inversely proportional to $(V_{GS} - V_T)$. Further, since the on-resistance $R_{on}$ is related to the capacitance $C_{ox}$ of the oxide layer 112, the mobility $\mu_n$ of electrons in the conductive channel, the width W of the transistor and the length L of the transistor, the on-resistance $R_{on}$ of the field-effect transistor can be expressed as:

$$R_{on} = \frac{1}{\mu_n C_{ox} \frac{W}{L}(V_{GS} - V_T)}$$

It can be seen from the above equation that the resistance of the field-effect transistor can be varied by adjusting the gate voltage $V_{GS}$ such that the channel resistance during turn-on is reduced to a value approaching zero or the resistance during turn-off is increased to another value approaching infinity. Therefore, the field-effect transistor can be designed as a switch for analog signals.

A field-effect transistor switch can be applied to a variety of circuits, such as a sample-and-hold circuit, a chopper circuit, an analog-to-digital converter, and a switch-capacitor filter.

The performance of a field-effect transistor switch has a connection with the capacitance of the gate oxide layer of the field-effect transistor, because the gate oxide layer of the field-effect transistor become thinner and thinner as the size of the field-effect transistor becomes smaller so that more field-effect transistors can be installed on a single chip. Further, because the conductive electrons move along the channel at an interface between the oxide layer and the semiconductor, the interface between the oxide layer and the semiconductor has to be fabricated as smooth as possible. Moreover, because a substrate of the semiconductor has a characteristic of low resistance, parasitic capacitance effects and leakage currents emerge between metal wires connecting the transistors by the smooth turn-on interface and the low-resistance substrate of the semiconductor, affecting the switching speed and operating efficiency of the field-effect transistor switch.

In the main-stream semiconductor manufacturing process, a gate oxide layer can have a thickness as small as 1.2 nanometer, a thickness of five stacked atoms. Under such a size, every physical phenomenon obeys the quantum physics such that a tunneling effect can no longer be ignored. Moreover, the tunneling effect enables electrons to have the chance to pass over the potential barrier formed by the oxide layer to generate leakage currents, which are one of the most dominant sources for a modern integrated circuit chip to consume power. Further, the parasitic capacitance is slight capacitance actually existing between conductive wires and a silicon substrate on the integrated circuit. When the signal frequency becomes high, the loss of the small signal of the circuit due to the parasitic capacitance effect is too large to be ignored.

Please refer to FIG. 2, which is a circuit diagram using a field-effect transistor as a single-pole-single-throw switch according to the prior art. A conventional single-pole-single-throw circuit 20 at least comprises a switch field-effect transistor 21 in charge of a switching function of the circuit, and an isolation field-effect transistor 22 for improving the isolation when the circuit is turned off. The properties of a switch circuit require that it is better for the switch field-effect transistor 21 to have a small on-resistance $R_{on}$, in order to reduce the signal loss due to too large a resistance when the circuit is turned on. When the switch field-effect transistor 21 is turned off, it is better for the isolation field effect transistor 22 to have a small on-resistance $R_{on}$, in order to for the switch circuit to have a well isolation when turned off. As implied in the above equation of the on-resistance $R_{on}$ of the field-effect transistor, when the substrate is limited to be manufactured by a certain material and the external applied voltage is specified specifically, the on-resistances of the above two transistors can be adjusted by changing the width and the length of the transistors. However, the length of a transistor is limited by a semiconductor manufacturing process and is constant, it is a common way to change the on-resistance by adjusting the width of the field-effect transistor.

In summary, in order to ensure the quality of signals passing through the switch, the conventional field-effect transistor single-pole-single-throw selects a switch transistor with a larger width, so as to reduce the on-resistance of the switch transistor and the loss of signals over transmission, to ensure the quality of the transistor switch. However, since the width of the transistor is increased, the area of the oxide layer capacitor included in the transistor is increased accordingly, and the parasitic capacitance of the transistor is increased accordingly.

Therefore, how to provide a field-effect transistor single-pole-single-throw switch circuit device, which prevents signal loss due to the emerged parasitic capacitance when selecting a switch transistor having a larger width, is becoming an urgent task in the art.

SUMMARY OF THE INVENTION

Accordingly, an objective of the present invention is to provide transistor single-pole-single-throw circuit device, which prevents signal loss due to the emerged parasitic capacitance when selecting a switch transistor with a larger width.

The transistor single-pole-single-throw circuit device of the present invention includes a transistor single-pole-single-throw circuit having a first transistor and a second transistor, the first transistor having a first gate, a first source and a first drain, the second transistor having a second gate, a second source and a second drain connected to the first source, the first transistor and the second transistor forming a series-shunt structure; and an inductor capacitor (LC) resonator having two ends connected to the first source and the first drain, respectively.

In an embodiment of the present invention, the transistor single-pole-single-throw circuit device further comprises a third transistor having a third gate, a third source and a third drain. The third drain is connected to the second drain. The second source and the third source are grounded. The first gate, the second gate and the third gate are all connected to an external control voltage source. Each control voltage controls the operating states of each transistor.

In another embodiment of the present invention, the transistor single-pole-single-throw circuit device further comprises an antenna connected to the first drain for receiving external wireless communication signals.

In further another embodiment of the present invention, the transistor single-pole-single-throw circuit device further comprises a single transceiver module connected to the second drain for receiving wireless communication signals.

Compared with the prior art, the transistor single-pole-single-throw circuit device includes an LC resonator having an inductor and a capacitor connected to a first source and a first drain of a first transistor, respectively, and has the first transistor and a second transistor to form a series-shunt structure. Since the inductor and the parasitic capacitance of the transistor generate coupling resonance, the signal loss due to the emerged parasitic capacitance when the conventional single-pole-single-throw circuit selects a switch transistor with a larger width is reduced.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification.

Figure 1:
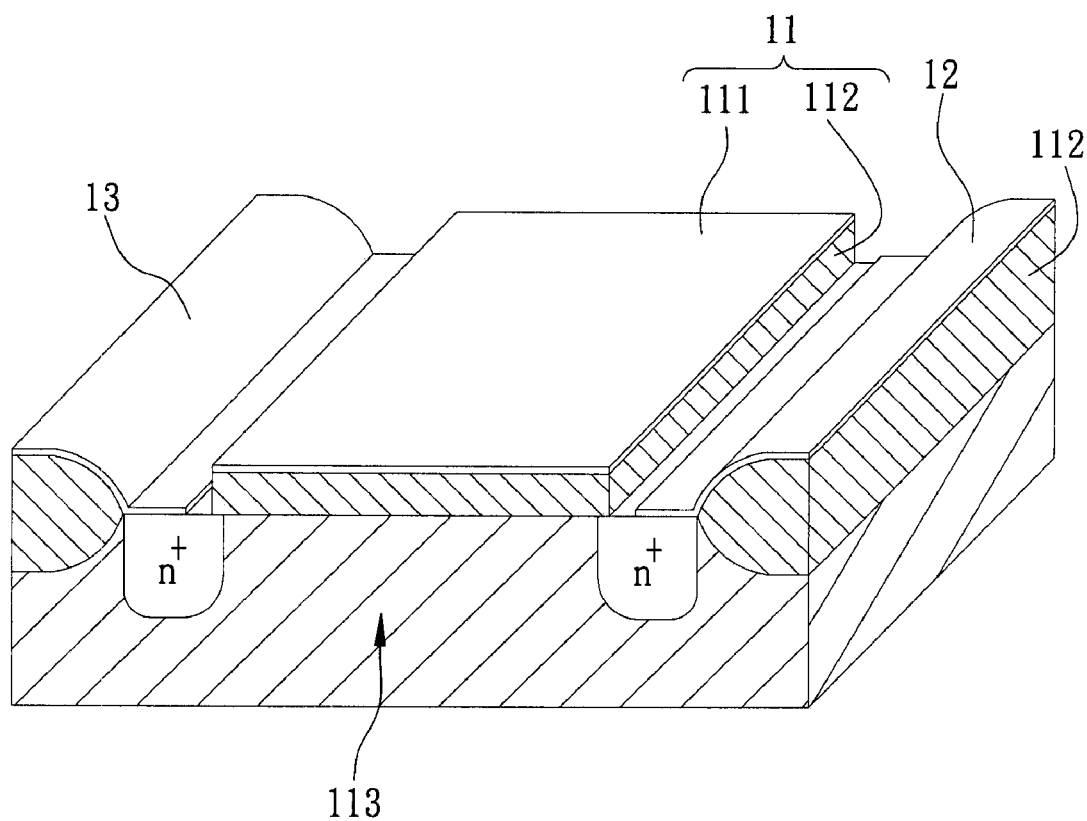
FIG. 1 shows a structural diagram of a field-effect transistor according to the prior art.
Figure 2:
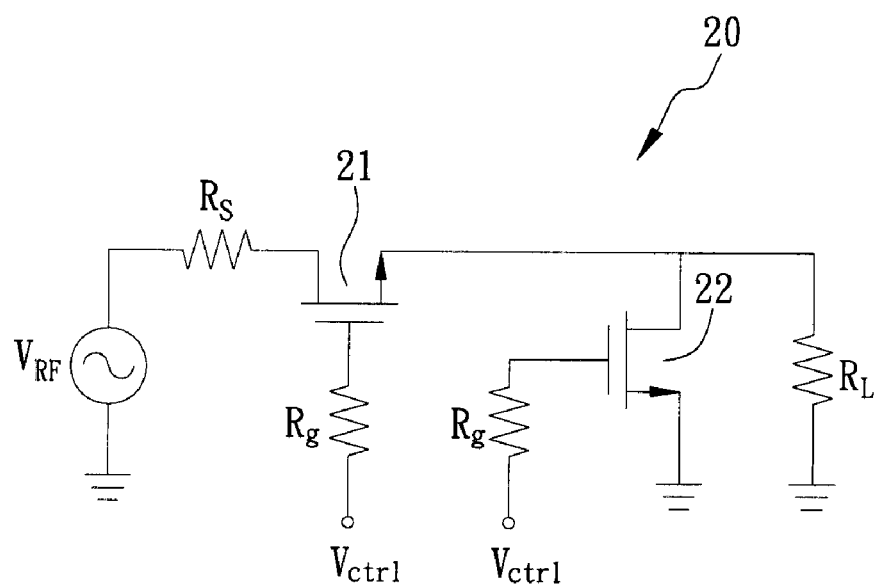
FIG. 2 is a circuit diagram using a field-effect transistor as a single-pole-single-throw according to the prior art.
Figure 3:
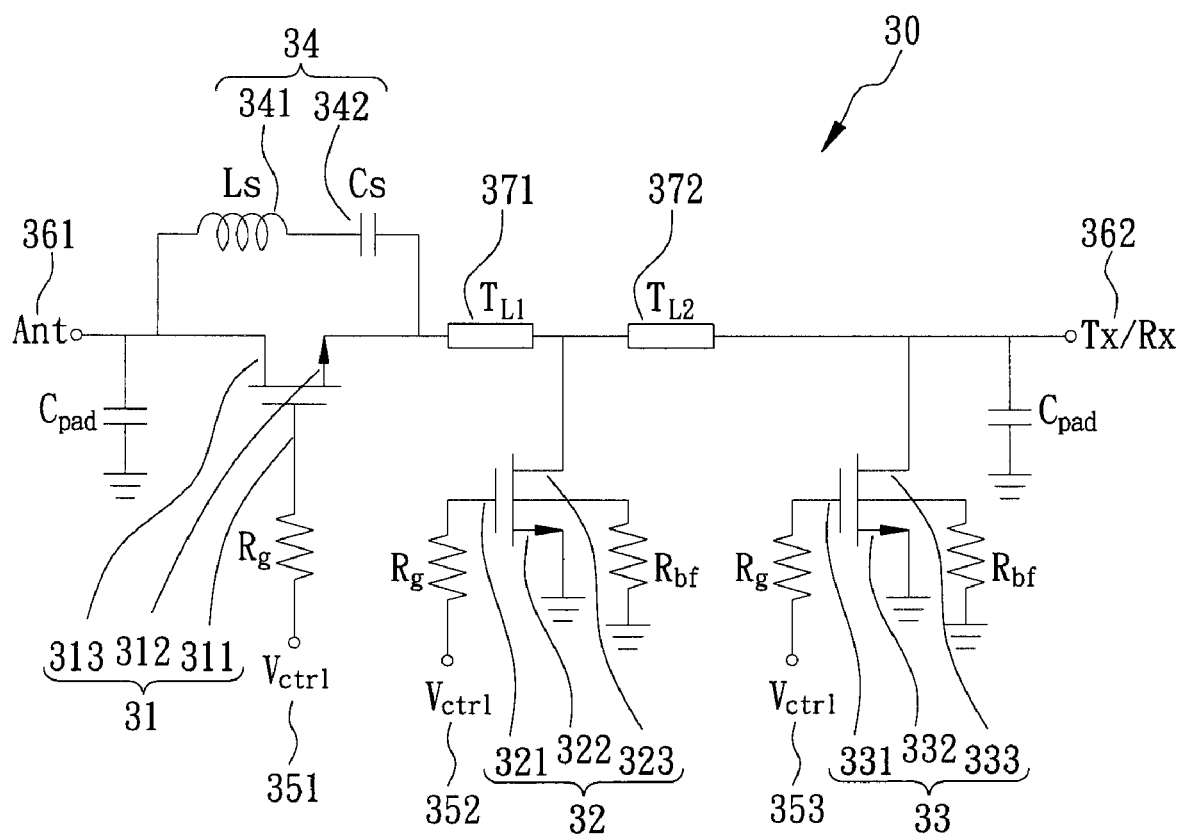
FIG. 3 is a circuit diagram of the present invention.

Please refer to FIG. 3, which is a circuit diagram of a transistor single-pole-single-throw circuit device 30 according to the present invention. The transistor single-pole-single-throw circuit device 30 comprises a first transistor 31 having a first gate 311, a first source 312 and a first drain 313; a second transistor 32 connected in series to the first transistor 31 and having a second gate 321, a second source 322 and a second drain 323, the second drain 323 being connected to the first source 312, the first transistor 31 and the second transistor 32 forming a series-shunt structure; and an inductor capacitor (LC) resonator 34 having an inductor 341 and a capacitor 342 connected in series with the inductor 341, and two ends connected to the first source 312 and the first drain 313, respectively.

In the embodiment, the transistor single-pole-single-throw circuit device 30 further comprises a third transistor 33 having a third gate 331, a third source 332 and a third drain 333. The third drain 333 is connected to the second drain 323. The second source 322 and the third source 332 are both grounded. The first gate 311 is connected to a first control voltage source 351, the second gate 321 is connected to a second control voltage source 352, and the third gate 331 is connected to a third control voltage source 353. The control voltage sources 351, 352 and 353 are used to control the operating states of the transistors 31, 32 and 33, respectively.

In the embodiment, the transistor single-pole-single-throw circuit device 30 further comprises an antenna 361 connected to the first drain 313 for receiving external wireless communication signals.

Preferably, the transistor single-pole-single-throw circuit device 30 further comprises a single transceiver module 362 connected to the second drain 323. The second drain 323 receives wireless communication signals when the transistor single-pole-single-throw circuit device 30 is turned on.

Preferably, a first transmission line (TL) 371 is further connected between the first source 312 and the second drain 323, and a second transmission line 372 is further connected between the third drain 333 and the second drain 323, in order to enhance the transmission efficiency.

Note that in the embodiments of the present invention the third transistor 33, the antenna 361, the single transceiver module 362 and/or the first transmission line 371 and second transmission line 372 can be selectively applied to various embodiments of the present invention, as known to persons having ordinary skills in the art. The above embodiments are merely used to describe the preferred embodiment of the present invention.

Therefore, the transistor single-pole-single-throw circuit device 30 adopts the LC resonator 34, which has the inductor 341 and the capacitor 342 connected in series with the inductor 341 and is connected to the first source 312 and the first drain 313 of the first transistor 31, the first transistor 31 being connected in series with the second transistor 32, with the first transistor 31 and the second transistor 32 forming a series-shunt structure. Since the inductor 341 and the parasitic capacitance of the transistors can generate coupling resonance, the signal loss due to the emerged parasitic capacitance when the conventional single-pole-single-throw circuit selects a switch transistor with a larger width is reduced.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A transistor single-pole-single-throw circuit device, comprising:

a transistor single-pole-single-throw circuit comprising at least a first transistor having a first gate, a first source and a first drain, and a second transistor having a second gate, a second source and a second drain connected to the first source; and an inductor capacitor (LC) resonator having two ends connected to the first source and the first drain, respectively.

2. The transistor single-pole-single-throw circuit device of claim 1, further comprising a third transistor having a third gate, a third source and a third drain.

3. The transistor single-pole-single-throw circuit device of claim 2, wherein the third drain is connected to the second drain.

4. The transistor single-pole-single-throw circuit device of claim 2, wherein the second source and the third source are both grounded.

5. The transistor single-pole-single-throw circuit device of claim 2, wherein the first gate, the second gate and the third gate are each connected to a control voltage source.

6. The transistor single-pole-single-throw circuit device of claim 2, wherein the first source is connected to the second drain via a first transmission line, and the third drain is connected to the second drain via a second transmission line.

7. The transistor single-pole-single-throw circuit device of claim 1, wherein the inductor and the capacitor of the LC resonator are connected in series.

8. The transistor single-pole-single-throw circuit device of claim 1 further comprising an antenna connected to the first drain.

9. The transistor single-pole-single-throw circuit device of claim 1 further comprising a single transceiver module connected to the second drain.

* * * * *